United States Patent
Tran et al.

(10) Patent No.: US 6,442,718 B1
(45) Date of Patent: Aug. 27, 2002

(54) MEMORY MODULE TEST SYSTEM WITH REDUCED DRIVER OUTPUT IMPEDANCE

(75) Inventors: Dong Tran, San Jose; David Jeffrey, Santa Cruz; Steven C. Krow-Lucal, Sunnyvale, all of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/378,876

(22) Filed: Aug. 23, 1999

(51) Int. Cl.[7] .......................... G11C 29/00; G11C 7/00; G01R 31/28; G06F 11/00
(52) U.S. Cl. .................. 714/721; 714/742; 365/201
(58) Field of Search ................. 714/740, 742, 714/721; 365/200, 201

(56) References Cited

U.S. PATENT DOCUMENTS

| | | | | |
|---|---|---|---|---|
| 5,107,230 A | * | 4/1992 | King | 326/86 |
| 5,134,311 A | * | 7/1992 | Biber et al. | 327/108 |
| 5,146,161 A | | 9/1992 | Kiser | |
| 5,430,400 A | * | 7/1995 | Herlein et al. | 327/108 |
| 5,559,441 A | * | 9/1996 | Desroches | 324/647 |
| 5,745,003 A | * | 4/1998 | Wakimoto et al. | 327/382 |
| 5,856,758 A | * | 1/1999 | Joffe et al. | 330/85 |
| 6,208,161 B1 | * | 3/2001 | Suda | 326/30 |
| 6,262,927 B1 | * | 9/2001 | Beigel et al. | 365/201 |
| 6,285,744 B1 | | 9/2001 | Nero, Jr. et al. | |
| 6,288,969 B1 | * | 9/2001 | Gibbins et al. | 365/230.05 |

FOREIGN PATENT DOCUMENTS

| | | |
|---|---|---|
| EP | 0 404 940 | 1/1991 |
| JP | 11038097 A * 2/1999 | G01R/31/28 |
| WO | 97/24622 | 7/1997 |

OTHER PUBLICATIONS

Sylla, I.T.; Slamani, M.; Kaminska, B.; Hossein, F.M. and Vincent, P. ; Impedance mismatch and lumped capacitance effects in high frequency testing; VLSI Test Symposium, 1998. Proceedings. 16th IEEE , 1998 pp.: 239–244.*
Dziuk, "High Speed Test Adapters in the Functional Test Environment," IEEE Systems Readiness Technology Conference, Sep. 1990, pp. 287–289.
International Search Report, application No. PCT/US 00/22660, mailed Jan. 26, 2001.

* cited by examiner

Primary Examiner—Albert Decady
Assistant Examiner—Joseph D. Torres
(74) Attorney, Agent, or Firm—Conley, Rose & Tayon, PC; B. Noël Kivlin (57) ABSTRACT

A memory module test system with reduced driver output impedance. A test system includes a plurality of driver circuits, each of which is coupled to a transmission line on a loadboard. The loadboard includes a socket for insertion of the memory module to be tested. A test signal is generated and driven onto a transmission line by a driver circuit. A duplicate test signal is driven by a separate driver circuit onto a separate transmission line. The transmission lines carrying the test signal and duplicate test signal are electrically shorted on the loadboard. Electrically shorting these transmission lines effectively reduces their impedance by half. Multiple test signals generated by the test system are shorted in this manner in order to allow the electrical environment of the test system to more closely approximate that of the application environment of the tested memory module.

20 Claims, 6 Drawing Sheets

Actual

Fig. 6A

Simulation

1

MEMORY MODULE TEST SYSTEM WITH REDUCED DRIVER OUTPUT IMPEDANCE

BACKGROUND OF THE INVENTION

1. Field of the Invention

The invention relates to Automated Test Equipment (ATE) for memory modules, and more specifically, to methods of making the test environment more closely match the application environment of the tested memory module.

2. Description of the Relevant Art

Automated test equipment (ATE) is widely used in the electronics industry to insure that electronic devices meet specifications and functionality requirements. Automated test equipment exists for nearly every type of testable electronic device. Typically, test equipment is configured to test a certain type of electronic device. For example, some testers are dedicated to testing circuit boards, while others test individual chips, and others may test memory modules.

Most automated test equipment can perform a wide variety of tests on a given electronic device. The three main types of tests are parametric testing, functional testing, and testing for manufacturing defects. Parametric testing checks a device for electrical characteristics and parameters, such as voltages, currents, resistances, capacitance, and so forth. Functional testing checks a device for proper functionality. Typically, a group of test signals, known as test vectors, are applied to the device under test (DUT), and the tester then checks the responses to the applied test signals to ensure proper functionality. Testing can also be done exclusively to check for manufacturing defects. Typical manufacturing defects that are tested for include short circuits, open circuits, misoriented parts and wrong parts. Testing for manufacturing defects often overlaps with parametric testing and functional testing.

A typical test system contains two basic elements. The first of these elements is a testing unit, sometimes referred to as an instrument bay. A typical testing unit includes voltage and current sources, signal generators, a variety of measurement equipment, and a number of relays for connecting various sources and instruments to the device under test. The second element is an adapter unit which couples the device under test to the testing unit. The form of the adapter unit will vary with the type of device to be tested. For example, an adapter for testing a circuit board with test points will typically be a bed-of-nails fixture, while a memory module tester will use a specialized circuit board, known as a loadboard, to couple the device under test to the testing unit.

As previously stated, automated test equipment exists for a wide variety of electronic devices, including testers which are specific to memory modules. Testers specific to memory modules typically perform a number of parametric and functional tests on various types of memory modules. Parametric tests include tests for timing, current output on given pins, and current leakage tests between given pins. Functional tests include read/write tests to given blocks of memory cells and tests of certain signal lines, such as chip enable lines and write enable lines.

A typical memory module test system couples the device under test to the testing unit through a loadboard. A loadboard is a specially designed circuit board having a variety of electrical loads analogous to the application environment. The loadboard also includes a number of signal lines, which serve as transmission lines for test system drivers. These test system drivers are used to drive test signals to the device under test.

One factor limiting the accuracy of automated test systems is the difference between the testing environment and the application environment. Since these environments have different electrical characteristics, accuracy for some types of tests performed can be compromised. This is particularly true in test systems for memory modules. As computers have become faster, the requirement for memory modules operating at higher speeds has increased correspondingly. Differences in resistive and capacitive loads in the test system with respect to the application environment can alter the timing of various signals. For example, the differences between the electrical environments of the application and the tester may result in a lower maximum slew rate (i.e. the rate of change of a signal) when a memory module is under test. This can place an upper limit on the frequency at which the memory module can be tested, and often times this frequency is less than that of the application environment.

For a memory module test system, the difference between the electrical environments of the application and the test system can be reduced through the careful design of the loadboard. However, this can only overcome some of the limitations imposed by the test system with respect to the application environment. One such limitation results from the output impedance of the test system drivers. In many cases, driver output impedance is greater than the typical line impedances in the application environment. For example, a memory module test system may include drives that have an output impedance of 50 ohms, while the typical line impedance in the application environment is 25 ohms. This impedance mismatch can result in a slower slew rate for the device under test. As a result of the slower slew rate, tests may be limited in frequency, and often times this frequency will be less than the operating frequency of the application environment. The impedance mismatch may also skew various test and timing signals, further limiting the frequency of the test. With these considerations in mind, it would be desirable to more closely match the electrical environments of the tester and application in by matching driver impedance to the line impedance of the application.

SUMMARY OF THE INVENTION

The problems outlined above may in large part be solved by a memory module test system with reduced driver output impedance in accordance with the present invention. In one embodiment, a memory module tester includes a testing unit and a loadboard. The testing unit contains a plurality of driver circuits for driving test signals to the memory module under test. The testing unit also contains various instruments for receiving output signals from the device under test. The testing unit generates all test signals and test vectors required to perform a test on the memory module, and is configured to determine whether the device under test meets the required specifications, by comparing received output signals with known acceptable values.

The loadboard is used to couple the memory module to the test system. The loadboard includes a plurality of resistors and capacitors, and is designed to electrically approximate the application environment of the memory module to be tested. The loadboard includes a socket in which the memory module to be tested can be inserted. Circuit lines on the loadboard serve as transmission lines, and are electrically coupled to the driver circuits of the testing unit. The loadboard also includes a plurality of jumper wires. The wires are soldered to circuit pads or vias located on the boards. Each via is electrically connected to a circuit line associated with a driver circuit. The jumper wires are used to create short circuits between pairs of circuit lines.

As previously stated, the testing unit generates all test signals for test system. The test signals are driven to the device under test through the loadboard via driver circuits. The output impedance of each driver circuit is approximately 50 ohms in this embodiment. For each test signal generated, a duplicate test signal is driven to the loadboard through a second driver circuit. The circuit lines associated with the two duplicate test signals are shorted together by the jumper wire on the loadboard. Since the two driver circuits share a common ground, shorting them together effectively places them in parallel. By placing two driver circuits in parallel, the effective output impedance of the drivers is reduced by half, to approximately 25 ohms.

Thus, in various embodiments, the memory module test system with reduced line driver impedance may allow the test environment of a memory module to closely match the electrical environment of the application. Reducing the effective driver output impedance allows the loadboard to more closely approximate the electrical environment of the application for the memory module under test. This closer approximation may allow the memory module to be tested at a higher bus frequency.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scoped of the present invention as defined be the appended claims.

DETAILED DESCRIPTION OF THE INVENTION

Figure 1:
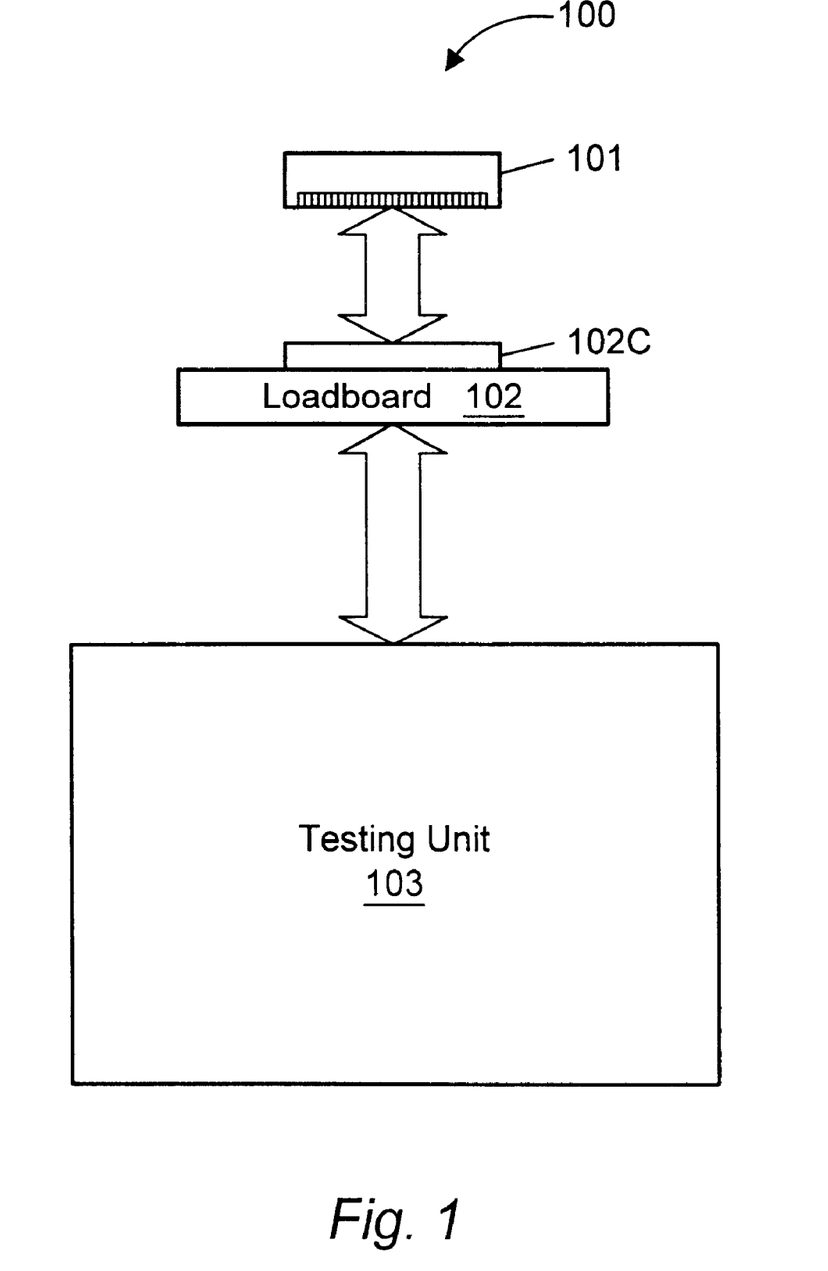
FIG. 1 is a block diagram of the memory module test system.

Turning now to FIG. 1, a block diagram of the memory module test system 100 is shown. Memory module test system 100 is a general purpose test system for memory modules, and is made up of two basic elements: a loadboard 102 and a testing unit 103. Loadboard 102 is coupled to testing unit 103, and features a connector socket 102C that is adapted for insertion of memory module 101. Loadboard 102 is a printed circuit board including a plurality of resistors and capacitors, and is designed to electrically approximate the application environment of the memory module to be tested. A unique loadboard design is required for each type of memory module to be tested.

Figure 2:
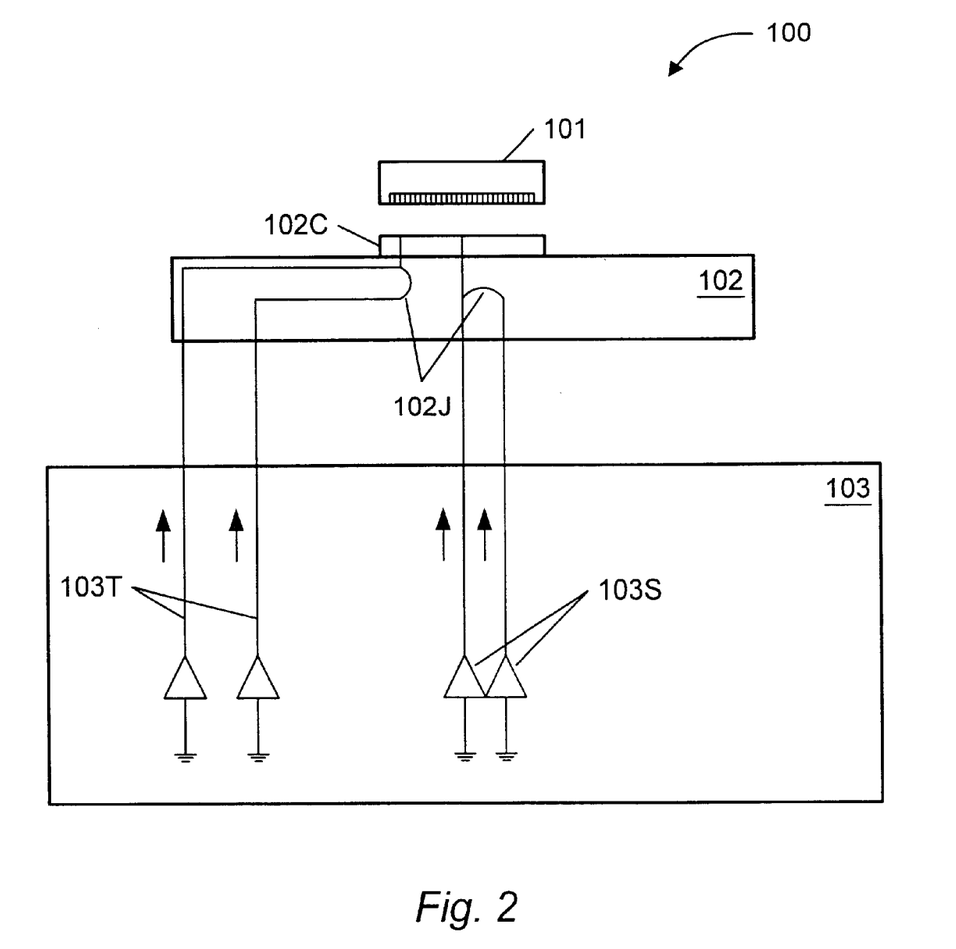
FIG. 2 is a block diagram of the memory module test system illustrating the configuration of the drivers.

Referring to FIG. 2, a block diagram of memory module test system 100 illustrating the driver configuration is shown. In order to test memory module 101, it is first inserted into connector socket 102C of loadboard 102. Test signals from testing unit 103 are driven to the memory module by drivers 103S. Transmission lines 103T convey the test signals from drivers 103S to the loadboard. Transmission lines 103T are electrically shorted together, in pairs, by jumpers 102J on loadboard 102. Drivers 103S drive duplicate test signals onto those transmission lines that are electrically shorted. In the embodiment shown, a first and second pair of test signals and corresponding duplicate signals are generated by drivers 103S. The effect of shorting the transmission lines carrying duplicate test signals will be discussed further below.

Figure 3:
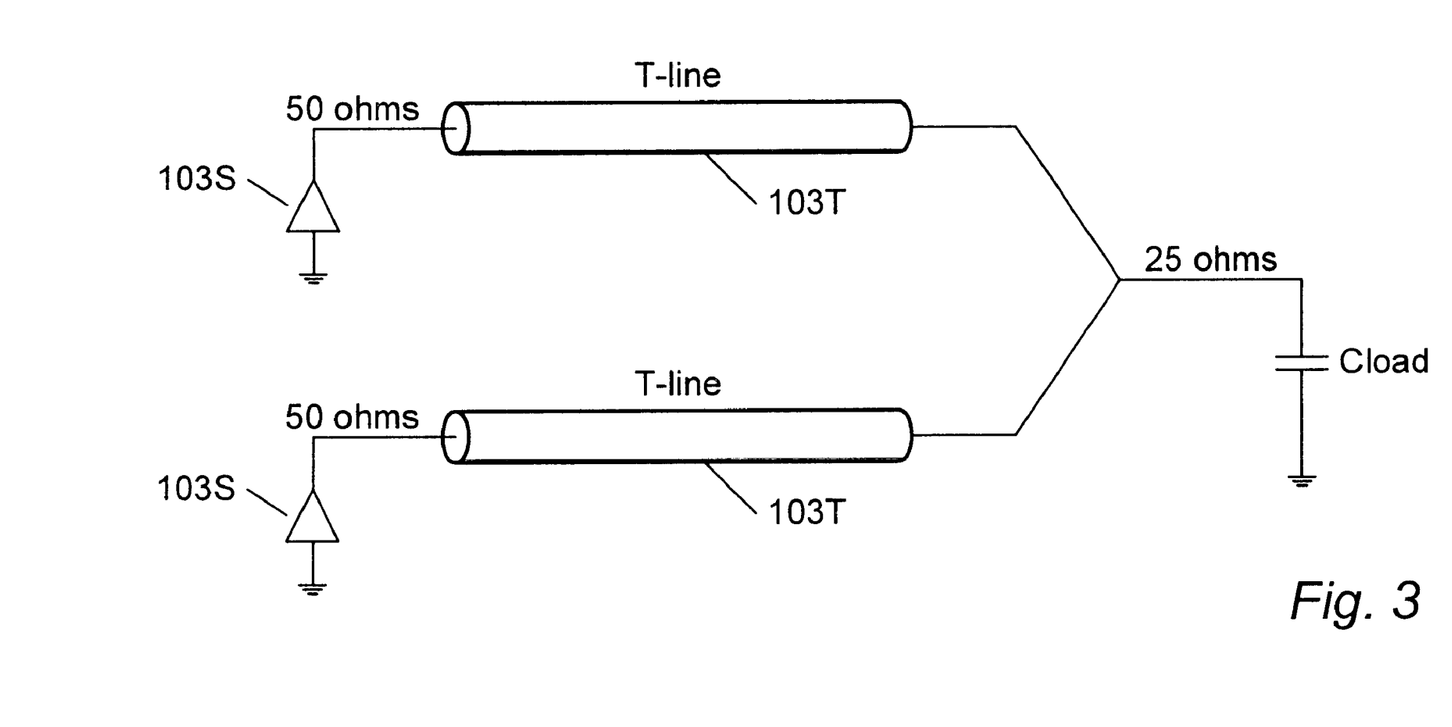
FIG. 3 is a schematic of the driver configuration for the memory module test system.

FIG. 3 is a schematic of the driver configuration for the memory module test system. In this schematic, two drivers 103S produce identical test signals. These signals are driven onto transmission lines 103T. These transmission lines are electrically shorted together on the loadboard 102 of FIGS. 1 and 2. The output impedance of each of the drivers 103S is approximately 50 ohms. Both drivers 103S share a common ground. Thus, by driving duplicate test signals onto transmission lines 103T that are electrically shorted together, the two driver/transmission line combinations are placed in parallel. This effectively creates a single driver with an output impedance of 25 ohms. The 25 ohm driver is connected to a load on the memory module under test, shown here as a capacitive load. Effectively creating a driver with an output impedance of 25 ohms allows memory module 101 of FIGS. 1 and 2 to be tested in an electrical environment that more closely matches that of the application.

Figure 4:
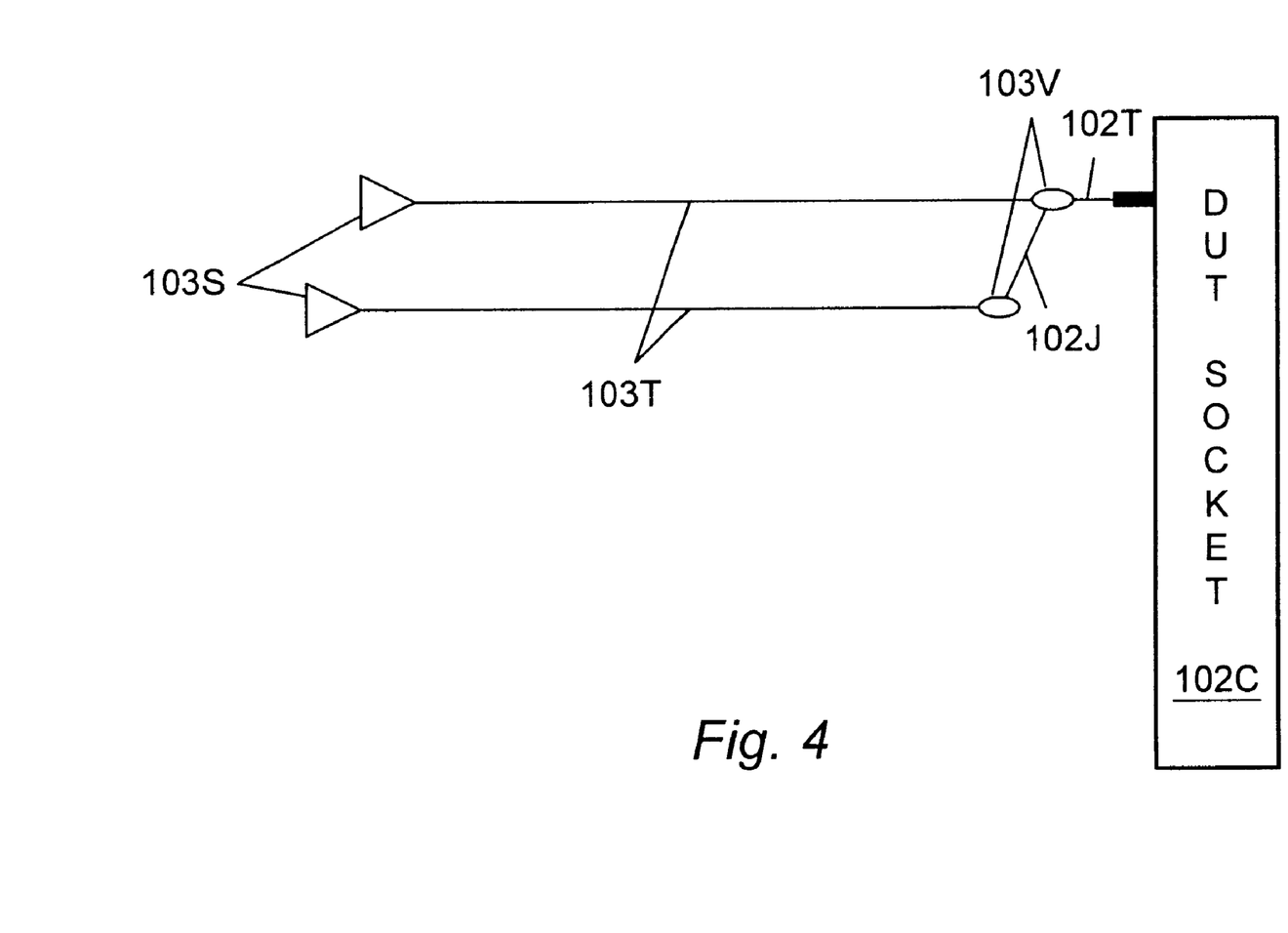
FIG. 4 is a schematic of the driver configuration for the memory module test system illustrating the jumper configuration near the memory module socket of the loadboard.

FIG. 4 is another schematic of the driver configuration, illustrating the jumper configuration near the memory module socket of the loadboard A pair of drivers 103S generate duplicate test signals, which are driven onto transmission lines 103T. These transmission lines are implemented as signal traces on loadboard 102 of FIGS. 1 and 2. The signal traces for each pair of transmission lines carrying duplicate test signals are routed in close physical proximity to each other. The signal traces terminate at apertures 103V in the loadboard. These apertures 103V can be a circuit board via or a plated-through hole. Apertures 103V are electrically connected by a jumper 102J, shorting the two transmission lines together. Apertures 103V are located on the loadboard in close physical proximity of each other in order to keep the jumper short, thus ensuring good impedance characteristics on each of the transmission lines. A separate circuit trace 102T couples one of the apertures 103V to the connector socket 102C of the loadboard.

Figure 5:
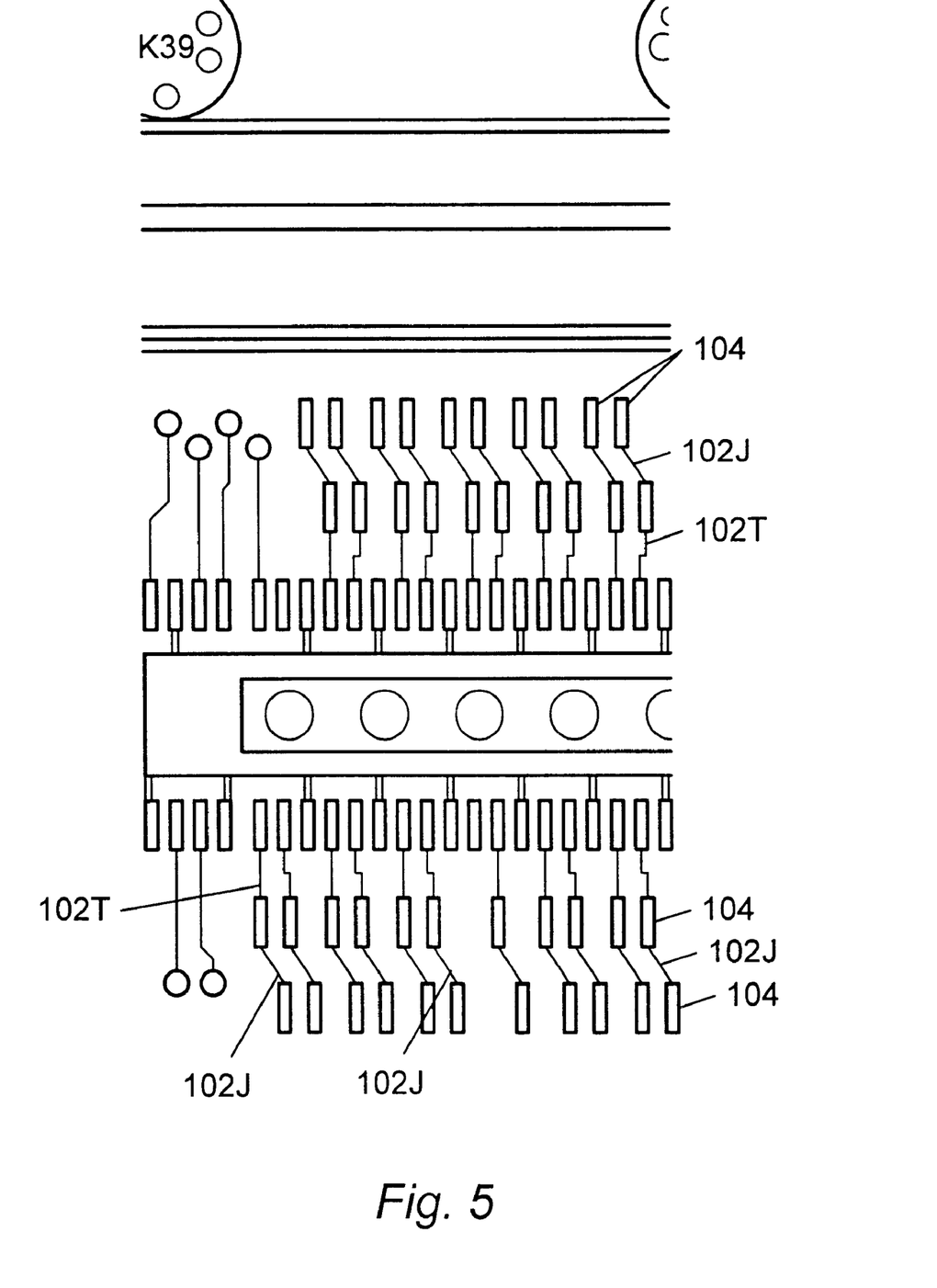
FIG. 5 is a drawing illustrating the jumper wires used to short two transmission lines together in one embodiment.

FIG. 5 is a drawing illustrating the jumper wires used to electrically short two transmission lines together in one embodiment. In this embodiment, jumper 102J is a short wire that electrically connects two vias or pads 104 on the loadboard. Each via 104 is associated with a transmission line 102T, which in turn is electrically coupled to drivers 103S of FIGS. 2, 3, and 4. Transmission lines 102T are implemented as circuit traces on the loadboard in this embodiment.

Figure 6A:
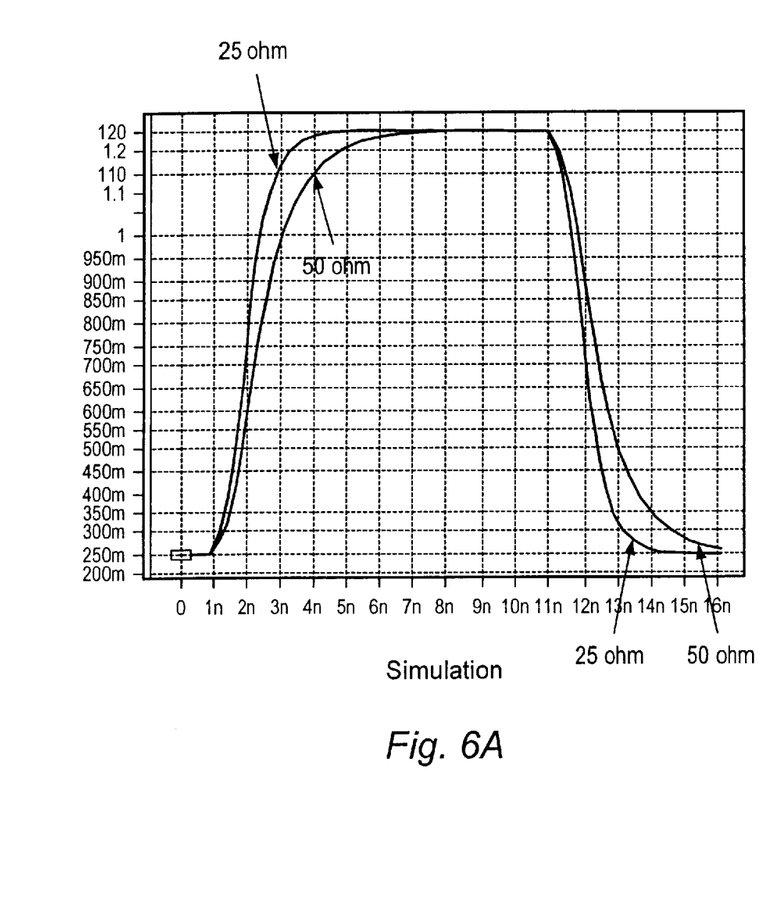
FIG. 6A is a graph of a simulated timing pulses, illustrating the improved slew rate resulting from a 25 ohm driver impedance compared with that of a 50 ohm driver impedance.

FIG. 6A is a graph of a simulated timing pulses, illustrating the improved slew rate resulting from a 25 ohm driver impedance compared with that of a 50 ohm driver impedance. FIG. 6A shows two timing pulses, one for a standard 50 ohm driver, and another for a 25 ohm driver created by placing in parallel two transmission lines associated with 50 ohm drivers. The rising edge of each timing pulse begins one nanosecond (designated in on the horizontal axis) into the simulation. The timing pulse associated with the 25 ohm driver reaches its full signal strength and stabilizes approximately 5 nanoseconds after beginning of the rising edge. In contrast, the timing pulse associated with the 50 ohm driver is not stable until approximately 7.5 nanoseconds has elapsed. The falling edge for both pulses begins at 11 nanoseconds. The timing pulse associated with the 25 ohm driver stabilizes at approximately 14.5 nanoseconds, while the pulse associated with the 50 ohm driver is still not stabilized after 16 nanoseconds.

Figure 6B:
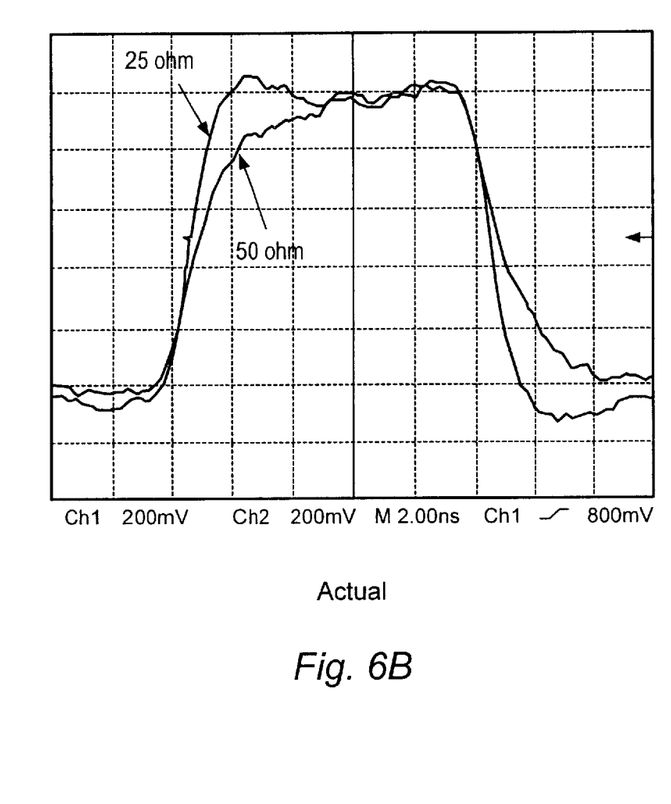
FIG. 6B is a graph of actual timing pulses, from an oscilloscope display, illustrating the improved slew rate resulting from a 25 ohm driver impedance compared with that of a 50 ohm driver impedance.

FIG. 6B is a graph of actual timing pulses, from an oscilloscope display, illustrating the improved slew rate resulting from a 25 ohm driver impedance compared with that of a 50 ohm driver impedance. As in FIG. 6A, timing pulses for both a 25 ohm driver and a 50 ohm driver are shown. As can be seen in the graph, the timing pulse associated with the 25 ohm driver has a much faster slew rate than the pulse associated with the 50 ohm driver. The faster slew rate associated with the 25 ohm driver may allow for shorter clock cycles, and thus, a corresponding increase of the frequency at which the memory module may be tested.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A test system for testing a memory module, said test system comprising:
   a testing unit configured to generate a test output signal and a duplicate version of said test output signal to be used in a test operation of said memory module, said testing unit including a plurality of driver circuits, wherein said test output signal and said duplicate version of said test output signal are each driven by a separate driver circuit; and
   a loadboard including a socket which accommodates insertion of said memory module, wherein said loadboard is configured to receive said test output signal and said duplicate version of said test output signal via respective transmission lines, and wherein said loadboard electrically shorts said respective transmission lines whereby an effective impedance associated with said transmission lines at their joining is reduced by approximately half the impedance of each of said separate driver circuits, and wherein said loadboard is a printed circuit board, the printed circuit board including a plurality of resistors and capacitors in order to electrically approximate the application environment of said memory module.

2. The test system as recited in claim 1, wherein said test unit is configured to generate at least a second test output signal and a duplicate version of said second output signal, wherein said second test output signal and said duplicate version of said second output signal are each driven by different driver circuits.

3. The test system as recited in claim 2, wherein said loadboard is configured to receive said second test output signal and said duplicate version of said second output test signal via a set of additional respective transmission lines, wherein said additional respective transmission lines are electrically shorted together on said loadboard.

4. The test system as recited in claim 1, wherein said driver circuits are configured to drive test signals to said memory module.

5. The test system as recited in claim 1, wherein said testing unit includes a plurality of instruments for measuring voltage and/or current.

6. The test system as recited in claim 1, wherein said memory module is adapted for insertion in a socket, said socket mounted upon said loadboard.

7. The test system as recited in claim 6, wherein said loadboard includes a plurality of jumper wires, each of said jumper wires configured to electrically short at least two of said transmission lines.

8. The test system as recited claim 7, wherein impedance of said transmission lines associated with each of said driver circuits is substantially 50 ohms.

9. The test system as recited in claim 1, wherein said memory module includes a plurality of Static Random Access Memory (SRAM) chips.

10. The testing unit as recited in claim 1, wherein said testing unit is configured to test said memory module for electrical characteristics and functionality.

11. A method for testing a memory module comprising:
   generating a test output signal in a testing unit, said testing unit including a plurality of driver circuits, and a duplicate version of said test output signal to be used in a test operation of said memory module, wherein said test output signal and said duplicate version of said test output signal are each driven by a separate driver circuit; and
   receiving said test output signal and said duplicate of said test output signal via respective transmission lines on a loadboard, said loadboard including a socket which accommodates insertion of said memory module, wherein said loadboard electrically shorts said respective transmission lines whereby an effective impedance associated with said transmission lines at their joining is reduced by approximately half the impedance of each of said separate driver circuits, wherein said loadboard is a printed circuit board, the printed circuit board including a plurality of resistors and capacitors in order to electrically approximate the application environment of said memory module.

12. The method as recited in claim 11, wherein said testing unit is configured to generate at least a second test output signal and a duplicate version of said second output signal, wherein said second test output signal and said duplicate version of said second output signal are each driven by different driver circuits.

13. The method as recited in claim 12, wherein said loadboard is configured to receive said second test output signals and said duplicate version of said second output test signal via a set of additional respective transmission lines, wherein said additional respective transmission lines are electrically shorted together on said loadboard.

14. The method as recited in claim 11, wherein said driver circuits are configured to drive test signals to said memory module.

15. The method as recited in claim 11, wherein said testing unit includes a plurality of instruments for measuring voltage and/or current.

16. The method as recited in claim 11, wherein said memory module is adapted for insertion in a socket, said socket mounted upon said loadboard.

17. The method as recited in claim 16, wherein said loadboard includes a plurality of jumper wires, each of said jumper wires configured to electrically short at least two of said transmission lines.

18. The method as recited in claim 17, wherein impedance of said transmission lines associated with each of said driver circuits is substantially 50 ohms.

19. The method as recited in claim 11, wherein said memory module includes a plurality of Static Random Access Memory (SRAM) chips.

20. The method as recited in claim 11, wherein said testing unit is configured to test said memory module for electrical characteristics and functionality.

* * * * *